US012658277B2

(12) United States Patent
Liu et al.

(10) Patent No.: US 12,658,277 B2
(45) Date of Patent: Jun. 16, 2026

(54) ENHANCED ERROR CORRECTION CODE FOR ERROR DETECTION AND CORRECTION IN MULTI-LEVEL CELL-BASED MEMORY DEVICES

(71) Applicant: TetraMem Inc., Fremont, CA (US)

(72) Inventors: Lei Liu, Singapore (SG); Jun Sheng Ng, Singapore (SG); Yudi Dou, Singapore (SG); Qiang Wei, San Ramon, CA (US)

(73) Assignee: TETRAMEM INC., San Jose, CA (US)

( * ) Notice: Subject to any disclaimer, the term of this patent is extended or adjusted under 35 U.S.C. 154(b) by 186 days.

(21) Appl. No.: 18/390,423

(22) Filed: Dec. 20, 2023

(65) Prior Publication Data

US 2025/0210126 A1     Jun. 26, 2025

(51) Int. Cl.
  G11C 29/52     (2006.01)
  G11C 13/00     (2006.01)
  G11C 29/02     (2006.01)
(52) U.S. Cl.
  CPC .......... G11C 29/52 (2013.01); G11C 13/0033 (2013.01); G11C 29/022 (2013.01)
(58) Field of Classification Search
  CPC .... G11C 29/52; G11C 13/0033; G11C 29/022

USPC ...................................................... 365/185.09
See application file for complete search history.

(56)           References Cited

U.S. PATENT DOCUMENTS

| | | | |
|---|---|---|---|
| 10,769,013 B1 * | 9/2020 | MacLaren | G06F 3/0619 |
| 2014/0245096 A1 | 8/2014 | Motwani et al. | |
| 2017/0308431 A1 | 10/2017 | Otterstedt et al. | |
| 2022/0413959 A1 * | 12/2022 | Sethumadhavan ... | G06F 3/0679 |
| 2023/0092380 A1 * | 3/2023 | Choi | G06F 3/0619 |
| | | | 711/156 |

* cited by examiner

*Primary Examiner* — Amir Zarabian
*Assistant Examiner* — Minh Dinh
(74) *Attorney, Agent, or Firm* — Jaffery Watson Hamilton & DeSanctis LLP

(57)           ABSTRACT

Methods for enhanced error correction code for error detection and correction in multi-level cell-based memory devices are provided. The methods include receiving, at an error correction code (ECC) decoder hardware device, data encoded with ECC information from a multi-level cell-based memory device; calculating an error value and an error location for an error in the data using Reed-Solomon (RS) error correction code (ECC); determining an error type of the error, wherein the error type comprises one of no error, a single symbol error in the data, or multiple symbol errors in the data, and wherein determining the error type is based on a +1/−1 error constraint; and responsive to the error type comprising multiple symbol errors, repeating a read of the data from the multi-level cell-based memory device.

20 Claims, 5 Drawing Sheets

300

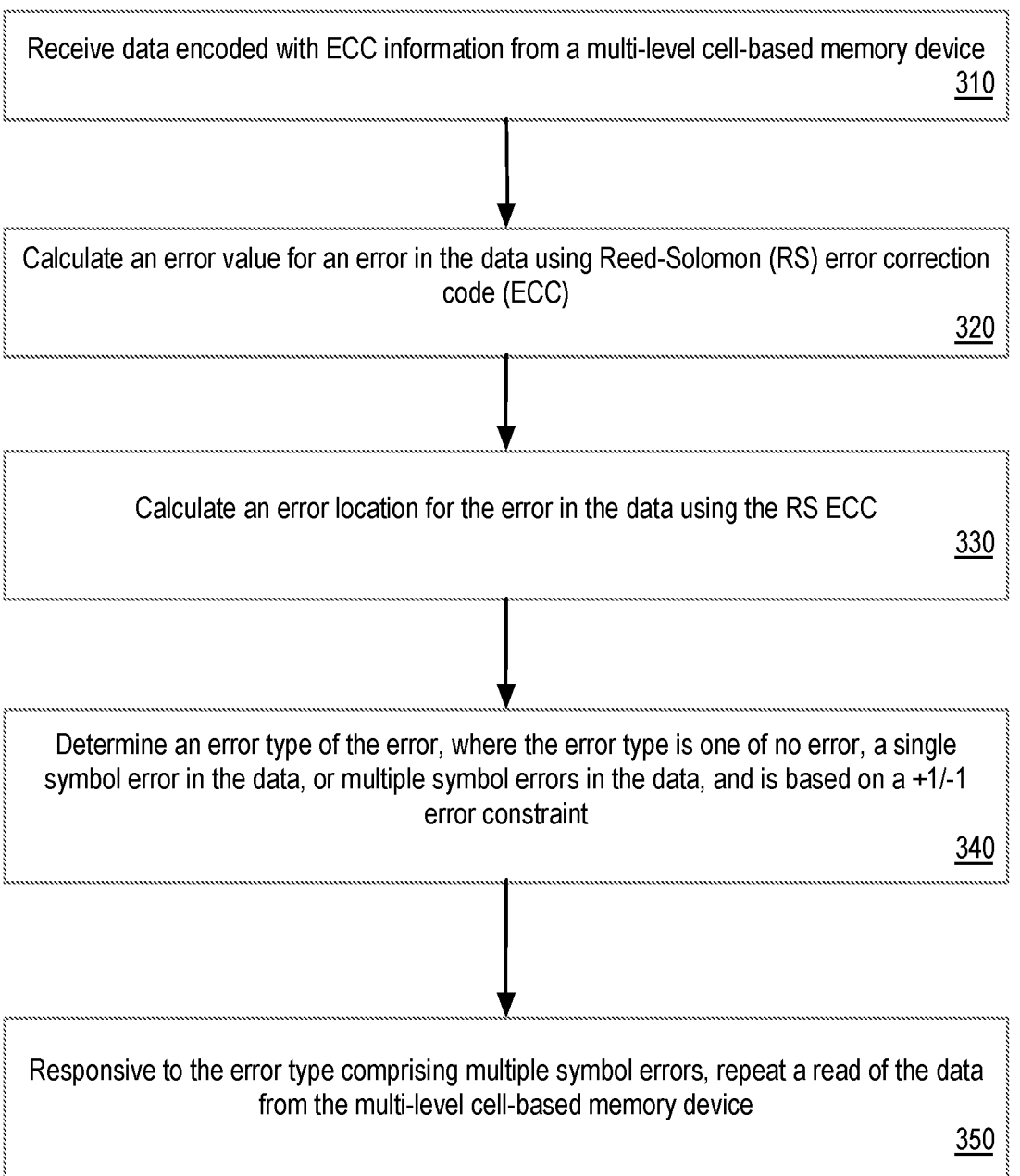

Receive data encoded with ECC information from a multi-level cell-based memory device
310

Calculate an error value for an error in the data using Reed-Solomon (RS) error correction code (ECC)
320

Calculate an error location for the error in the data using the RS ECC
330

Determine an error type of the error, where the error type is one of no error, a single symbol error in the data, or multiple symbol errors in the data, and is based on a +1/-1 error constraint
340

Responsive to the error type comprising multiple symbol errors, repeat a read of the data from the multi-level cell-based memory device
350

Figure 4:
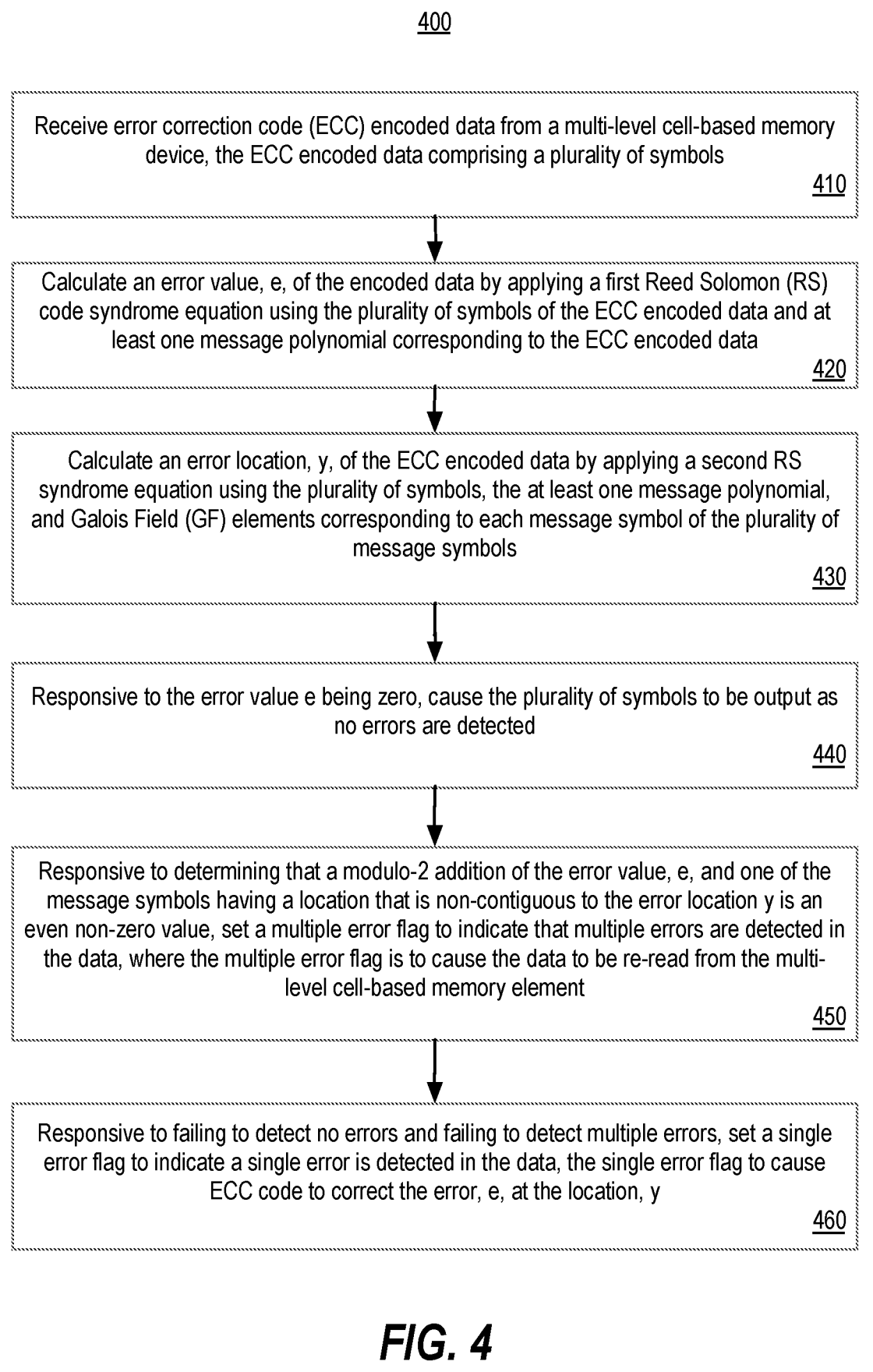

Receive error correction code (ECC) encoded data from a multi-level cell-based memory device, the ECC encoded data comprising a plurality of symbols

410

Calculate an error value, e, of the encoded data by applying a first Reed Solomon (RS) code syndrome equation using the plurality of symbols of the ECC encoded data and at least one message polynomial corresponding to the ECC encoded data

420

Calculate an error location, y, of the ECC encoded data by applying a second RS syndrome equation using the plurality of symbols, the at least one message polynomial, and Galois Field (GF) elements corresponding to each message symbol of the plurality of message symbols

430

Responsive to the error value e being zero, cause the plurality of symbols to be output as no errors are detected

440

Responsive to determining that a modulo-2 addition of the error value, e, and one of the message symbols having a location that is non-contiguous to the error location y is an even non-zero value, set a multiple error flag to indicate that multiple errors are detected in the data, where the multiple error flag is to cause the data to be re-read from the multi-level cell-based memory element

450

Responsive to failing to detect no errors and failing to detect multiple errors, set a single error flag to indicate a single error is detected in the data, the single error flag to cause ECC code to correct the error, e, at the location, y

ENHANCED ERROR CORRECTION CODE FOR ERROR DETECTION AND CORRECTION IN MULTI-LEVEL CELL-BASED MEMORY DEVICES

TECHNICAL FIELD

The implementations of the disclosure relate generally to error detection and correction in multi-level cell-based memory devices including resistive random-access memory (RRAM) devices and, more specifically, to enhanced error correction code for error detection and correction in multi-level cell-based memory devices.

BACKGROUND

Multiple level (multi-level) cell-based memory devices refer to a memory structure having a plurality of memory cells that are capable of storing more than a single bit of information. A memory cell can consist of a single floating-gate metal-oxide-semiconductor field-effect transistor (MOSFET). One example type of multi-level cell-based memory device is a memristor (also referred to as resistive random-access memory (RRAM or ReRAM)).

RRAM has features of low power consumption and smaller size, but as part of it, it also experiences a conversion read error rate that can be high and, as such, utilizes ECC (Error Correction Code) to address this conversion read error rate. One type of ECC code utilized for controlling errors, such as errors experienced in RRAM and other multi-level cell-based memory devices, is Reed-Solomon (RS) code. RS code is an efficient code to correct errors during data translation. However, RS code has a limit that can detect and correct a limited amount of symbol errors in multi-level cell-based memory devices. If more errors than the RS code limit occur, the RS code cannot detect this, which can result in a high error rate when reading from memory.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, a method for enhanced error correction code for error detection and correction in multi-level cell-based memory devices is provided. The method includes: receiving, at an error correction code (ECC) decoder hardware device, data encoded with ECC information from a multi-level cell-based memory device; calculating an error value and an error location for an error in the data using Reed-Solomon (RS) error correction code (ECC); determining an error type of the error, wherein the error type comprises one of no error, a single symbol error in the data, or multiple symbol errors in the data, and wherein determining the error type is based on a +1/−1 error constraint; and responsive to the error type comprising multiple symbol errors, repeating a read of the data from the multi-level cell-based memory device.

In some embodiments, the multi-level cell-based memory device comprises a resistive random-access memory (RRAM) device.

In some embodiments, the method further includes responsive to the error type comprising a single symbol error, correcting the error value at the error location using error correction circuitry of the ECC decoder hardware device.

In some embodiments, the method further includes responsive to the error type comprising no error, causing the data to be transmitted from the ECC decoder hardware device, wherein the error type comprises no error when the error value is equal to zero.

In some embodiments, determining the error type of the error further includes: performing modulo-2 addition of the error value and a message symbol of the data having a location that is non-contiguous to the error location; and responsive to a result of the modulo-2 addition being an even non-zero value, setting a multiple error flag to indicate the error type of multiple symbol errors.

In some embodiments, the method further includes setting a single error flag to indicate the error type of a single symbol error when the error type is not no error and is not multiple symbol errors.

In some embodiments, calculating the error value using RS ECC further includes applying a first RS ECC syndrome equation using a plurality of symbols of the data and at least one message polynomial corresponding to the data.

In some embodiments, calculating the error location using RS ECC further includes applying a second RS ECC syndrome equation using the plurality of symbols of the data, the at least one message polynomial corresponding to the data, and Galois Field (GF) elements corresponding to each symbol of the plurality of symbols.

According to one or more aspects of the disclosure, an error correction code (ECC) decoder hardware device for enhanced error correction code for error detection and correction in multi-level cell-based memory devices is described, the ECC decoder hardware device including: error correction hardware circuitry; and error detection hardware circuitry communicably coupled to the error correction hardware circuitry, the error detection hardware circuitry to: receive data encoded with ECC information from a multi-level cell-based memory device; calculate an error value and an error location for an error in the data using Reed-Solomon (RS) ECC; determine an error type of the error, wherein the error type comprises one of no error, a single symbol error in the data, or multiple symbol errors in the data, and wherein determining the error type is based on a +1/−1 error constraint; and responsive to the error type comprising multiple symbol errors, repeat a read of the data from the multi-level cell-based memory device.

In some embodiments, the multi-level cell-based memory device comprises a resistive random-access memory (RRAM) device.

In some embodiments, the error correction hardware circuitry is to correct the error value at the error location responsive to the error type comprising the single symbol error.

In some embodiments, the error detection hardware circuitry is further to, responsive to the error type comprising no error, cause the data to be transmitted from the ECC decoder hardware device, and wherein the error type comprises no error when the error value is equal to zero.

In some embodiments, the error detection hardware circuitry to determine the error type of the error further includes the error detection hardware circuitry to: perform modulo-2 addition of the error value and a message symbol of the data having a location that is non-contiguous to the error location; and responsive to a result of the modulo-2 addition being an even non-zero value, set a multiple error flag to indicate the error type of multiple symbol errors.

In some embodiments, the error detection hardware circuitry is further to set a single error flag to indicate the error type of a single symbol error when the error type is not no error and is not multiple symbol errors.

According to one or more aspects of the disclosure, an system for enhanced error correction code for error detection and correction in multi-level cell-based memory devices is described, the system including: a multi-level cell-based memory device comprising a plurality of memory cells configured to store more than a single bit of data; an error correction code (ECC) encoding device to encode input data with ECC data to generated encoded data to transmit to the multi-level cell-based memory device; and an ECC decoding device to: receive data encoded with ECC information from the multi-level cell-based memory device; calculate an error value and an error location for an error in the data using Reed-Solomon (RS) ECC; determine an error type of the error, wherein the error type comprises one of no error, a single symbol error in the data, or multiple symbol errors in the data, and wherein determining the error type is based on a +1/−1 error constraint; and responsive to the error type comprising multiple symbol errors, repeat a read of the data from the multi-level cell-based memory device.

In some embodiments, the multi-level cell-based memory device includes a resistive random-access memory (RRAM) device.

In some embodiments, the ECC decoding device is to correct the error value at the error location responsive to the error type comprising the single symbol error.

In some embodiments, the ECC decoding device is further to, responsive to the error type comprising no error, cause the data to be transmitted from the ECC decoding device, and wherein the error type comprises no error when the error value is equal to zero.

In some embodiments, the ECC decoding device to determine the error type of the error further includes the ECC decoding device to: perform modulo-2 addition of the error value and a message symbol of the data having a location that is non-contiguous to the error location; and responsive to a result of the modulo-2 addition being an even non-zero value, set a multiple error flag to indicate the error type of multiple symbol errors.

In some embodiments, the ECC decoding device is further to set a single error flag to indicate the error type of a single symbol error when the error type is not no error and is not multiple symbol errors.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

4

FIGS. 3 and 4 are flowcharts illustrating example processes for enhanced error correction code for error detection and correction in multi-level cell-based memory devices in accordance with some embodiments of the present disclosure.

Figure 5:
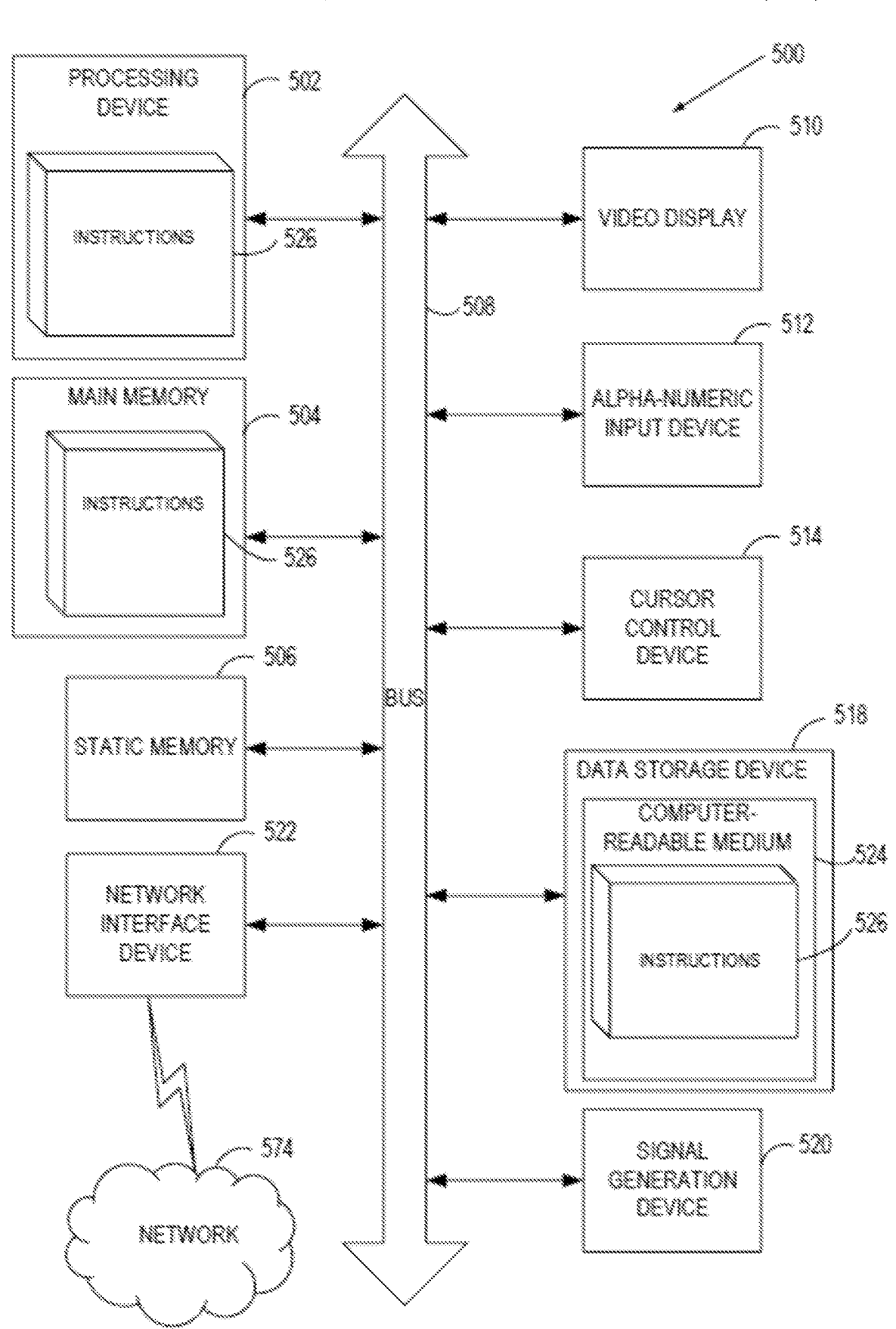

FIG. 5 illustrates a diagrammatic representation of a machine in the exemplary form of a computer system in accordance with some embodiments of the disclosure.

DETAILED DESCRIPTION

The disclosure provides mechanisms for enhanced error correction code for error detection and correction in multi-level cell-based memory devices. A multi-level cell-based memory device may refer to a memory structure having a plurality of memory cells that are capable of storing more than a single bit of information. A memory cell can consist of a single floating-gate metal-oxide-semiconductor field-effect transistor (MOSFET). One example type of multi-level cell-based memory device is a memristor (also referred to as resistive random-access memory (RRAM or ReRAM)).

Although implementations herein may apply to any variety of multi-level cell-based memory devices, the description herein may specifically reference one example type of multi-level cell-based memory device known as resistive random-access memory (RRAM) devices. A resistive random-access memory (RRAM) device is a two-terminal passive device with programmable resistance. An RRAM device may be electrically switched between a high-resistance state and a low-resistance state in response to the application of suitable programming signals. A forming process may refer to programming an RRAM device starting from a virgin state. The RRAM device may be programmed from the high resistance state to a lower resistance state in a setting process (also referred to as a "SET" operation). The RRAM device may be programmed from the low resistance state in a resetting process (also referred to as a "RESET" operation).

RRAM includes features of low power consumption and smaller size, but as part of it, it can exhibit a conversion read error rate that is high. As such, RRAM may utilize error correction code (ECC) to address this conversion read error rate. ECC is a technique used in digital systems to detect and correct errors that occur during data transmission or storage. It involves adding extra information, often referred to as parity bits, to the data being sent or stored. This extra information allows the receiver to identify and fix errors introduced by noise, interference, or other issues that might corrupt the data. Some examples of ECC include Hamming code, Cyclic Redundancy Code (CRC), and Reed-Solomon (RS) codes.

Implementations herein focus on RS code, which is known for its versatility and capability in correcting multiple errors, including both burst and random errors. RS codes operate on a block of data treated as a set of finite-field elements referred to a symbols. RS code is specified by RS(n,k), where n is the codeword length and k is the message length, both in terms of the number of symbols. The size of the symbols, m, is the number of bits in each symbol. For example, for RS(15,13) with m=4, the codeword length is 15×4 bits, and the message length is 13×4 bits. The error-correcting capability of the RS code is defined by t=(n−k)/2, which is the number of symbol errors that can be corrected by the RS code. In theory, an RS code detects/corrects up to t symbols error. When the number of symbol errors is greater than t, the RS code is neither capable of correcting nor detecting the error. Continuing with the above example of RS(15,13), the RS code results in t=1, meaning it is capable of correcting one symbol error.

The property of RS code innately fits well with multi-level cell-based memories, such as RRAM, where data converters (e.g., Analog-to-Digital Converters (ADCs)) are used to convert the stored information from the analog domain to the digital domain. Such conversion is prone to error, and hence RS code comes into play to fix the potential errors. As each symbol in the RS code can be matched to a single converter (e.g., ADC), a RS code is capable of correcting up to t converters' errors.

Although the properties of RS code fit well with RRAM applications, it is still preferable to keep the t smaller because the smaller the t is, the lesser the number of parity bits are utilized. This can eventually translate into lowering the cost of semiconductor manufacturing. However, when the t is small (e.g., t=1), the error-correcting capability is compromised.

In implementations herein, an enhanced approach to ECC for error detection and correction in multi-level cell-based memory devices is provided. The enhanced ECC of implementations herein leverages the properties of errors in data converters (such as ADCs) of multi-level cell-based memory devices in order to provide an implementation of RS code with error detection capabilities greater than t. The enhanced ACC approach of implementations herein is based on the fact that most of the errors occurring in data converters (e.g., ADCs) are not random, but rather +1 or −1 errors due to the least significant bit (LSB) accuracy issues. When a number of errors greater than t is detected by the enhanced ECC described herein, a re-read of the RRAM (or other multi-level cell-based memory device) can be performed (or re-conversion of data by data converters (e.g., ADCs)), as the chance of consecutive conversion error is low. This re-read of the memory can result in correction of the t detected multiple errors.

Implementations herein provide a technical advantage to the problems discussed above. For example, the ECC approach herein using enhanced RS code for error detection and correction can decrease the error rate experience by a multi-level cell-based memory device as compared with traditional RS code. Further detailed description regarding the enhanced ECC approach for error detection and correction is provided further below with respect to FIGS. 1-5.

Figure 1:
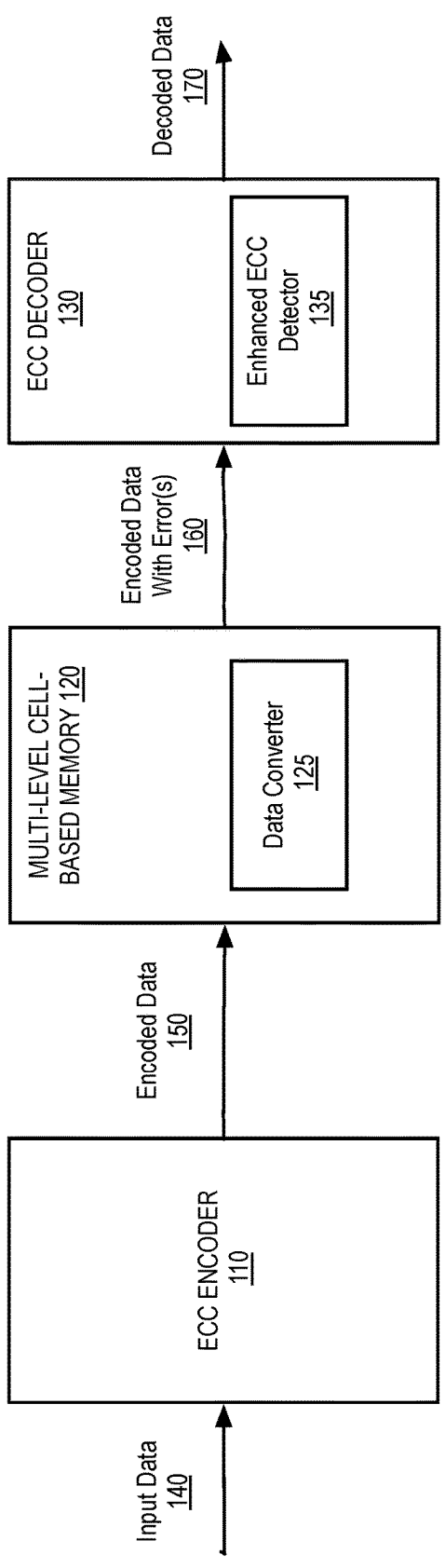
FIG. 1 is a diagram illustrating an example digital system in accordance with some implementations of the disclosure.

FIG. 1 is a diagram illustrating an example digital system 100 in accordance with some implementations of the disclosure. As shown, digital system 100 includes a multi-level cell-based memory 120 with ECC protection provided by an ECC encoder 110 and an ECC decoder 130. In implementations herein the multi-level cell-based memory 120 may be a memory structure having a plurality of memory cells that are capable of storing more than a single bit of information. As previously noted, one example type of multi-level cell-based memory 120 discussed herein is RRAM.

In implementations herein, an enhanced ECC approach may be implemented for multi-level cell-based memory 120. As part of the enhanced ECC approach, input data 140 may be provided to ECC encoder 110. ECC encoder 110 processes the input data using RS code to add extra information, such as parity bits, to the input data 140, resulting in encoded data 150. Encoded data 150 is sent to multi-level cell-based memory 120 for storage.

When the data is requested from multi-level cell-based memory 120, a data converter 125, such as an ADC or any other type of data converter hardware circuitry, may convert the encoded data from analog to digital format as part of responding to the data request. However, this data conversion process may introduce errors to the encoded data 150. As such encoded data with error(s) 160 may be output from the multi-level cell-based memory 120.

ECC decoder 130 may operate to analyze the encoded data with error(s) 160 to detect and/or correct any errors found in encoded data with errors 160. ECC decoder 130 can then output decoded data 170.

In implementations herein, ECC decoder 130 is enhanced with an enhanced ECC detector 135. Enhanced ECC detector 135 may be hardware circuitry configured to apply enhanced RS code to the encoded data with error(s) 160 to provide error detection capabilities greater than detection of t errors. The enhanced ECC detector 135 leverages the properties of errors in the data converter 125 of the multi-level cell-based memory 120 in order to provide an implementation of RS code with error detection capabilities greater than t. The noted properties include the statistic that most of the errors occurring in the data converter 125 are not random, but rather are +1 or −1 errors due to LSB accuracy issues. This +1/−1 error likelihood can be utilized by the enhanced ECC detector 135 to implement circuitry to determine when the number of detected errors exceeds the t of the RS code, and set a flag to indicate this occurrence. In turn, when it is determined that the number of errors greater than t is detected by the enhanced ECC detector 135, a re-read of the multi-level cell-based memory 120 can be performed which causes re-conversion of data by data converter 125. As the chance of consecutive conversion error is low, this re-read of the memory can result in correction of the t detected multiple errors. Further details of the enhanced ECC detection implemented by ECC decoder 130 is described below with respect to FIG. 2.

Figure 2:
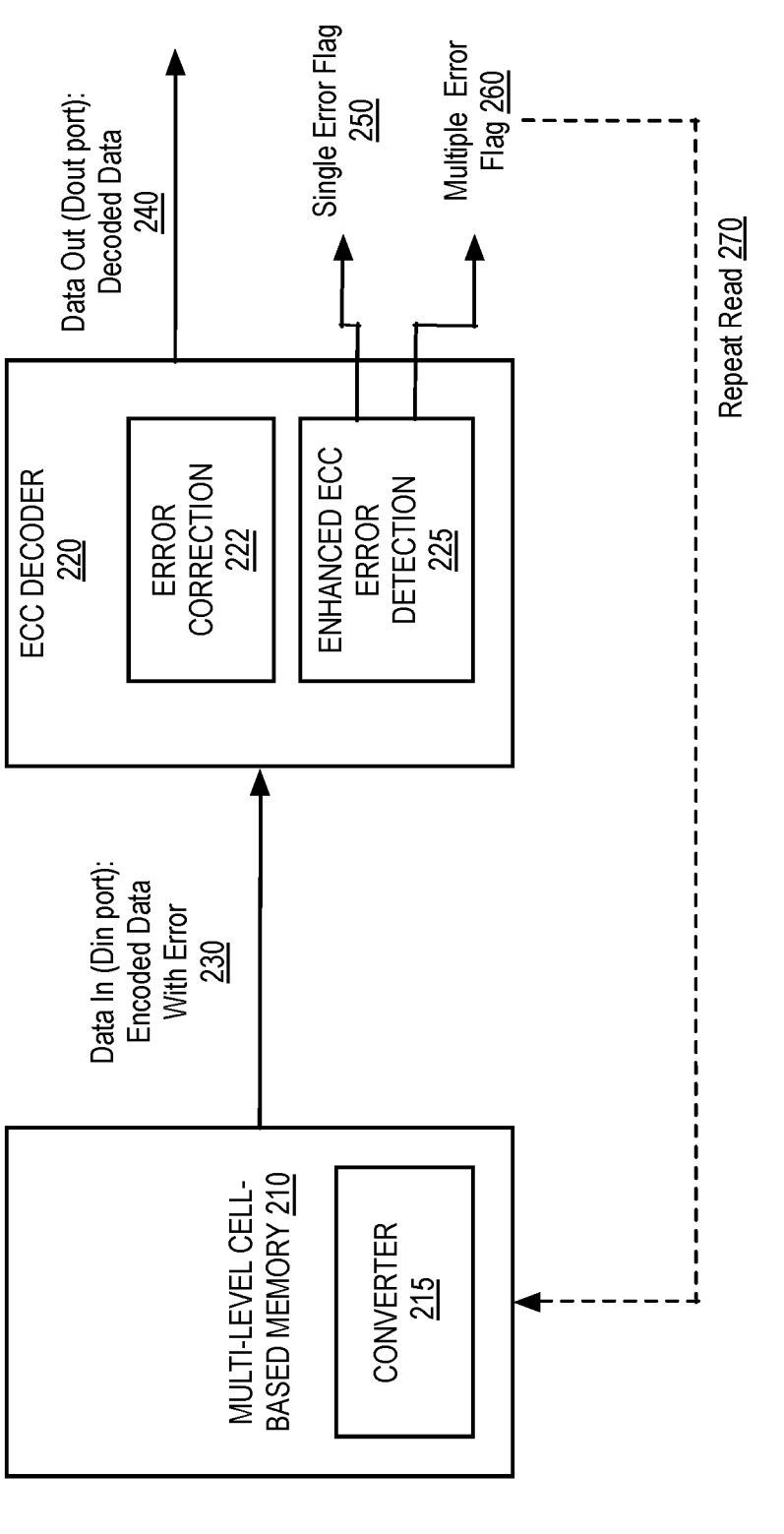
FIG. 2 is a diagram depicting an example digital system with a detailed view of a multi-level cell-based memory and an error correction code (ECC) decoder to provide enhanced ECC detection, in accordance with implementation herein.

FIG. 2 is a diagram depicting an example digital system 200 with a detailed view of a multi-level cell-based memory 210 and an ECC decoder to provide enhanced ECC detection, in accordance with implementation herein. In one implementation, multi-level cell-based memory 210 is the same as multi-level cell-based memory 120 described with respect to FIG. 1, and ECC decoder 220 is the same as ECC decoder 130 described with respect to FIG. 1.

Multi-level cell-based memory 210 may store data encoded with ECC information, such as parity bits. When this data is requested, converter 215 of multi-level cell-based memory 210 may convert the data from a first format into a second format, such as from an analog format to a digital format. This conversion from converter 215 may introduce errors into the stored data and, as such, the ECC decoder 220 processes this encoded data with error received at Din port 230.

ECC decoder 220 may include hardware circuitry for error correction 222 and enhance ECC error detection 225. Initially, enhanced ECC error detection 225 receives the encoded data with error on a data in (Din) port 230 for analysis using RS code. In RS code, when t=1, and the roots of the generative polynomial for the RS code are $\alpha_0$ and $\alpha_1$, and the syndrome equation is given by:

$$S_0 = \sum_{i=1}^{n} m_n$$

$$S_1 = \sum_{i=1}^{n} \alpha_n m_n$$

where S is the syndrome, n is the index of received message symbols, m is the message symbol, and $\alpha$ is the Galois Field (GF) element, and the summation is modulo-2 addition. Syndrome equation $S_0$ can identify the value of error(s) in the message symbols, while syndrome equation $S_1$ can identify an error location.

Whenever an error occurs, S becomes non-zero due to the properties of the RS code. When t=1, the correctable error only occurs when just one of the mi is corrupted. However, in the case of a data converter such as ADCs' error characteristics, the type of error can be constrained to +1/−1 errors, as previously discussed. This +1/−1 constraint introduces new properties to the RS code, as follows. First, the errors that occur are always odd numbers. Second, the modulo-2 addition of any two odd numbers is always an even number.

The above two properties can allow the enhanced ECC error detection 225 to differentiate between 1 symbol error and 2 symbol errors (or multiple symbol errors). Hence, instead of correcting/detecting just one symbol error (t=1), the enhanced ECC error detection 225 can further detect multiple (e.g., 2) symbol errors by exploiting the above two properties.

Implementations here are based on the +1/−1 constraint that states that two +1/−1 error symbols should not generate one fake +1/−1 error when the generator polynomial chooses $g(x)=(x-a^0)(x-a^1)$. With this theory and condition of the +1/−1 constraint, multiple (e.g., two or more) symbol errors can be detected by RS code using the enhanced ECC approach described in implementations herein.

For example, for any RS(n,n−2), the generator polynomial is as follows:

$$g(x) = (x - a^{\wedge}0)(x - a^{\wedge}1)$$

Furthermore, the syndrome equations are as follows:

$$S_0 = m_{n-3} + m_{n-4} + \ldots + m_0 + p_1 + p_0 = e$$
$$S_1 = m_{n-3}a^{n-1} + m_{n-4}a^{n-2} + m_0a^2 + p_1a^1 + p_0 = ea^y$$

where $m_{n-3}, m_{n-4} \ldots m_0, p_1$ and $p_0$ are encoded data received by the ECC decoder 220 on Din port 230. Furthermore, n is the index of received message symbols, m is the message symbol, $\alpha$ is the Galois Field (GF) element, and the summation is modulo-2 addition. All of the data are received at the same time.

In implementations herein, the enhanced ECC error detection 225 includes hardware circuitry configured to perform the following steps: (1) calculate error value "e", (2) find error location "y", and (3) determine error type. The error value "e" can be calculated by the equation for $S_0$ described above. The error location "y" can be calculated by the equation for $S_1$ described above.

The enhanced ECC error detection 225 can then Determine the error type based on the determined "e" and "y" values, for example as follows:

```
if (e == 0) then no error;
Else if(((e xor m_{y−2}) == m_{y−2}+1) or
(e xor m_{y−2}+1 == m_{y−2})) then mul_err;
else single_err.
```

Based on the determine error type, the enhanced ECC error detection 225 can take different courses of action. As noted above, if the e value indicates no error, then the decoded data is passed from the ECC decoder 220 on the Data out (Dout) port 240. If a single error type is determined, then the enhanced ECC error detection 225 can set a single error flag 250 which causes the data to be passed to error correction 222 circuitry to correct the single error using RS code. Then, the corrected data is passed from the ECC decoder 220 using the Dout port 240.

If an error type of multiple errors is detected, then the enhanced ECC error detection 225 can set a multiple error flag 260. When the multiple error flag 260 is set, it can cause a requester of the data to repeat the read 270 of the data from the multi-level cell-based memory 210. This re-read of the data causes a re-conversion of the data by converter 215, which in most cases can correct the data error(s). In this approach, the user can read multiple times when two (or more) symbols are detected until no reading or single error is detected. As such, two symbol errors can be corrected as well. In some embodiments, the ECC decoder 220 may be programmed with a configuration for enhanced ECC error detection 225 for implementing process 300 of FIG. 4 and/or process 400 of FIG. 4.

In the realm of digital data transmission and storage, the enhanced ECC approach described herein provides for technical advantages and is designed to address a pervasive real-world challenge. The enhanced ECC code of implementations herein excels in scenarios where errors frequently manifest as minor shifts of +1/−1 in the original signal. This innovation finds versatile applications across diverse domains, each benefiting from the error detection and correction capabilities described herein. It not only provides for data accuracy and integrity, but also enables dependable data handling across diverse industries, characterized by error-resilient digital ecosystems.

First, data storage systems, such as hard drives, solid-state drives, and optical storage devices, gain significantly from this innovation. The enhanced ECC approach of implementations herein acts as a robust protector of data integrity, effectively protecting data from corruption during read and write operations. This is invaluable for enterprise data centers and archival storage solutions, where vast volumes of data need to be preserved with minimal error risk.

Second, the enhanced ECC approach of implementations herein enhances the reliability of communication systems. In the realm of wireless communication, satellite links, and optical fiber networks, where data transmission contends with noisy environments, this enhancement provides for consistent and precise information flow. This attribute becomes helpful in scenarios where data integrity can influence critical outcomes, such as in emergency communication systems or high-frequency trading platforms.

Furthermore, in the automotive sector, which is increasingly characterized by autonomous vehicles, the enhanced ECC approach of implementations herein can provide for enabling both safety and reliability. Error-free data transmission is utilized for the various sensors and communication systems in this context.

Additionally, the healthcare industry, which is increasingly dependent on digital devices and networks, can benefit from the enhanced ECC approach of implementations herein. Medical devices employed for remote patient monitoring and telemedicine rely on accurate data transmission. The enhanced ECC approach described herein can aid in supporting the integrity of patient data transmitted across networks, thereby elevating the healthcare services and patient outcomes.

Lastly, in the realm of military and defense, where communication systems and data storage frequently operate within challenging environments, the enhanced ECC approach of implementations herein offers a layer of security and reliability. It aids in helping data remain intact and secure, even under adverse conditions, ultimately enhancing the effectiveness of defense operations.

FIG. 3 is a flowchart illustrating an example of a process 300 for enhanced error correction code for error detection and correction in multi-level cell-based memory devices in accordance with some implementations of the disclosure. Process 300 may be executed to perform an enhanced ECC error detection operation using RS code on a multi-level cell-based memory structure (memory device, memory element, etc.). The multi-level cell-based memory device may be multi-level cell-based memory 120 utilizing enhanced ECC detector 135 as described in connection with FIG. 1 and/or multi-level cell-based memory 210 utilizing enhanced ECC error detection 225 as described in connection with FIG. 2.

Process 300 may start at 310, where data is read from a multi-level cell-based memory device. In one implementation, the multi-level cell-based memory device is an RRAM device.

At 320, an error value is calculated for the data using RS ECC.

At 330, an error location is calculated for the data using the RS ECC.

At 340, an error type of the error is determined. In one implementation, the error type is one of no error, a single symbol error in the data, or multiple symbol errors in the data. In one implementation, the error type determination is based on a +1/−1 error constraint.

At 350, responsive to the error type comprising multiple symbol errors, a read of the data from the multi-level cell-based memory device is repeated.

FIG. 4 is a flow chart illustrating an example of a process 400 for enhanced error correction code for error detection and correction in multi-level cell-based memory devices in accordance with some implementations of the disclosure.

Process 400 may be executed to perform an enhanced ECC error detection operation using RS code on a multi-level cell-based memory structure (memory device, memory element, etc.). The multi-level cell-based memory device may be multi-level cell-based memory 120 utilizing enhanced ECC detector 135 as described in connection with FIG. 1 and/or multi-level cell-based memory 210 utilizing enhanced ECC error detection 225 as described in connection with FIG. 2.

Process 400 may start at 410, where ECC encoded data is received from a multi-level cell-based memory device. In one implementation, the ECC encoded data comprises a plurality of symbols. In one implementation, the multi-level cell-based memory device is an RRAM device.

At 420, an error value, e, of the encoded data is calculated by applying a first RS code syndrome equation using the plurality of symbols of the ECC encoded data and at least one message polynomial corresponding to the ECC encoded data.

At 430, an error location, y, of the ECC encoded data is calculated by applying a second RS syndrome equation using the plurality of symbols, the at least one message polynomial, and GF elements corresponding to each message symbol of the plurality of message symbols.

At 440, responsive to the error value e being zero, the plurality of symbols are caused to be output as no errors are detected.

At 450, responsive to determining that a modulo-2 addition of the error value, e, and one of the message symbols having a location that is non-contiguous to the error location y is an even non-zero value, set a multiple error flag to indicate that multiple errors are detected in the data. In one implementation, setting the multiple error flag causes the data to be re-read from the multi-level cell-based memory element.

At 460, responsive to failing to detect no errors and failing to detect multiple errors, a single error flag is set to indicate a single error is detected in the data. In one implementation, setting the single error flag causes ECC code to correct the error, e, at the location, y.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

FIG. 5 illustrates a diagrammatic representation of a machine in the exemplary form of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, or the Internet. The machine may operate in the capacity of a server or a client machine in client-server network environment or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computer system 500 includes a processing device (processor) 602, a main memory 504 (e.g., read-only memory (ROM), flash memory, dynamic random-access memory (DRAM) such as synchronous DRAM (SDRAM) or Rambus DRAM (RDRAM), etc.), a static memory 506 (e.g., flash memory, static random-access memory (SRAM), etc.), and a data storage device 518, which communicate with each other via a bus 508.

Processing device 502 represents one or more general-purpose processing devices such as a microprocessor, central processing unit, or the like. More particularly, the processing device 502 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 502 may also be one or more special-purpose processing devices such as an application-specific integrated circuit (ASIC), a field programmable gate array (FPGA), a digital signal processor (DSP), a network processor, or the like. The processing device 502 is configured to execute instructions 526 for performing the operations and steps discussed herein.

The computer system 500 may further include a network interface device 522. The computer system 500 also may include a video display unit 510 (e.g., a liquid crystal display (LCD), a cathode ray tube (CRT), or a touch screen), an alphanumeric input device 512 (e.g., a keyboard), a cursor control device 514 (e.g., a mouse), and a signal generation device 520 (e.g., a speaker).

The data storage device 518 may include a computer-readable storage medium 524 on which is stored one or more sets of instructions 526 (e.g., software) embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting computer-readable storage media. Instructions 526 may further be transmitted or received over a network 574 via the network interface device 522.

In one embodiment, instructions 526 include instructions and/or a software library for implementing process 300 of FIG. 3 and/or process 400 of FIG. 4. While the computer-readable storage medium 524 is shown in an exemplary implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A method comprising:

receiving, at an error correction code (ECC) decoder hardware device, data encoded with ECC information from a multi-level cell-based memory device;

calculating an error value and an error location for an error in the data using Reed-Solomon (RS) error correction code (ECC);

determining an error type of the error, wherein the error type comprises one of no error, a single symbol error in the data, or multiple symbol errors in the data, and wherein determining the error type is based on a +1/−1 error constraint; and responsive to the error type comprising multiple symbol errors, repeating a read of the data from the multi-level cell-based memory device.

2. The method of claim 1, wherein the multi-level cell-based memory device comprises a resistive random-access memory (RRAM) device.

3. The method of claim 1, further comprising responsive to the error type comprising a single symbol error, correcting the error value at the error location using error correction circuitry of the ECC decoder hardware device.

4. The method of claim 1, further comprising responsive to the error type comprising no error, causing the data to be transmitted from the ECC decoder hardware device, wherein the error type comprises no error when the error value is equal to zero.

5. The method of claim 4, wherein determining the error type of the error further comprises:

performing modulo-2 addition of the error value and a message symbol of the data having a location that is non-contiguous to the error location; and responsive to a result of the modulo-2 addition being an even non-zero value, setting a multiple error flag to indicate the error type of multiple symbol errors.

6. The method of claim 5, further comprising setting a single error flag to indicate the error type of a single symbol error when the error type is not no error and is not multiple symbol errors.

7. The method of claim 1, wherein calculating the error value using RS ECC further comprises applying a first RS ECC syndrome equation using a plurality of symbols of the data and at least one message polynomial corresponding to the data.

8. The method of claim 7, wherein calculating the error location using RS ECC further comprises applying a second RS ECC syndrome equation using the plurality of symbols of the data, the at least one message polynomial corresponding to the data, and Galois Field (GF) elements corresponding to each symbol of the plurality of symbols.

9. An error correction code (ECC) decoder hardware device, comprising:

error correction hardware circuitry; and error detection hardware circuitry communicably coupled to the error correction hardware circuitry, the error detection hardware circuitry to:

receive data encoded with ECC information from a multi-level cell-based memory device;

calculate an error value and an error location for an error in the data using Reed-Solomon (RS) ECC;

determine an error type of the error, wherein the error type comprises one of no error, a single symbol error in the data, or multiple symbol errors in the data, and wherein determining the error type is based on a $+1/-1$ error constraint; and responsive to the error type comprising multiple symbol errors, repeat a read of the data from the multi-level cell-based memory device.

10. The ECC decoder hardware device of claim 9, wherein the multi-level cell-based memory device comprises a resistive random-access memory (RRAM) device.

11. The ECC decoder hardware device of claim 9, wherein the error correction hardware circuitry is to correct the error value at the error location responsive to the error type comprising the single symbol error.

12. The ECC decoder hardware device of claim 9, wherein the error detection hardware circuitry is further to, responsive to the error type comprising no error, cause the data to be transmitted from the ECC decoder hardware device, and wherein the error type comprises no error when the error value is equal to zero.

13. The ECC decoder hardware device of claim 12, wherein the error detection hardware circuitry to determine the error type of the error further comprises the error detection hardware circuitry to:

perform modulo-2 addition of the error value and a message symbol of the data having a location that is non-contiguous to the error location; and responsive to a result of the modulo-2 addition being an even non-zero value, set a multiple error flag to indicate the error type of multiple symbol errors.

14. The ECC decoder hardware device of claim 13, wherein the error detection hardware circuitry is further to set a single error flag to indicate the error type of a single symbol error when the error type is not no error and is not multiple symbol errors.

15. A system comprising:

a multi-level cell-based memory device comprising a plurality of memory cells configured to store more than a single bit of data;

an error correction code (ECC) encoding device to encode input data with ECC data to generated encoded data to transmit to the multi-level cell-based memory device; and an ECC decoding device to:

receive data encoded with ECC information from the multi-level cell-based memory device;

calculate an error value and an error location for an error in the data using Reed-Solomon (RS) ECC;

determine an error type of the error, wherein the error type comprises one of no error, a single symbol error in the data, or multiple symbol errors in the data, and wherein determining the error type is based on a $+1/-1$ error constraint; and responsive to the error type comprising multiple symbol errors, repeat a read of the data from the multi-level cell-based memory device.

16. The system of claim 15, wherein the multi-level cell-based memory device comprises a resistive random-access memory (RRAM) device.

17. The system of claim 15, wherein the ECC decoding device is to correct the error value at the error location responsive to the error type comprising the single symbol error.

18. The system of claim 15, wherein the ECC decoding device is further to, responsive to the error type comprising no error, cause the data to be transmitted from the ECC decoding device, and wherein the error type comprises no error when the error value is equal to zero.

19. The system of claim 18, wherein the ECC decoding device to determine the error type of the error further comprises the ECC decoding device to:

perform modulo-2 addition of the error value and a message symbol of the data having a location that is non-contiguous to the error location; and responsive to a result of the modulo-2 addition being an even non-zero value, set a multiple error flag to indicate the error type of multiple symbol errors.

20. The system of claim 19, wherein the ECC decoding device is further to set a single error flag to indicate the error type of a single symbol error when the error type is not no error and is not multiple symbol errors.

* * * * *